United States Patent
Ando

[11] Patent Number: 5,920,231
[45] Date of Patent: Jul. 6, 1999

[54] NEGATIVE DIFFERENTIAL RESISTANCE AMPLIFIER

[75] Inventor: Yuji Ando, Tokyo, Japan

[73] Assignee: NEC Corporation, Tokyo, Japan

[21] Appl. No.: 08/907,949

[22] Filed: Aug. 11, 1997

[30] Foreign Application Priority Data

Aug. 13, 1996 [JP] Japan ..................................... 8-213502
Feb. 7, 1997 [JP] Japan ..................................... 9-025434

[51] Int. Cl.[6] .............................. H03F 15/00; H01L 29/06
[52] U.S. Cl. ......................... 330/61 R; 330/61 A; 257/25
[58] Field of Search ................................. 330/306, 61 A, 330/61 R; 257/25, 30; 331/107 R

[56] References Cited

U.S. PATENT DOCUMENTS

| | | | |
|---|---|---|---|
| 3,946,336 | 3/1976 | Froom | 331/107 R |
| 4,107,621 | 8/1978 | Furutani | 330/306 |
| 5,428,224 | 6/1995 | Hayashi | 257/25 |
| 5,514,876 | 5/1996 | Schneier | 257/25 |
| 5,665,978 | 9/1997 | Uenoyama | 257/30 |
| 5,705,825 | 1/1998 | Ando | 257/25 |

*Primary Examiner*—Robert Pascal
*Assistant Examiner*—Patricia Nguyen
*Attorney, Agent, or Firm*—Foley & Lardner

[57] ABSTRACT

There is provided a negative differential resistance amplifier comprising a negative differential resistance transistor having negative input conductance by utilizing resonant tunneling effect. The transistor is electrically connected to a signal source circuit in cascade, and the following relation is established in the negative differential resistance amplifier:

$$0 < gs - gi < G$$

wherein gs (gs>0) indicates a conductance measured when viewed from an interface between the negative differential resistance transistor and the signal source circuit to the signal source circuit, -gi (gi>0) indicates a conductance of the negative differential resistance transistor, and G (G<gs) indicates a predetermined conductance. The above mentioned negative differential resistance amplifier provides not only excellent signal unilaterality, but also higher gain, lower noise and wider band by setting certain matching conditions between the negative differential resistance transistor and the signal source circuit.

24 Claims, 9 Drawing Sheets

NEGATIVE DIFFERENTIAL RESISTANCE AMPLIFIER

BACKGROUND OF THE INVENTION

1. Field of the Invention

The invention relates to a negative differential resistance amplifier, and more particularly to a negative differential resistance amplifier suitable for a radio telescope and satellite communication which are required to operate with high frequency.

2. Description of the Related Art

As a negative differential resistance (hereinafter, referred to simply as "NDR") amplifier, one employing the Esaki diode has been known among those skilled in the art.

FIG. 1 is a circuit diagram illustrating an NDR amplifier employing the Esaki diode, reported by J. J. Tiemann, "Shot Noise in Tunnel Diode Amplifiers", Proceedings of the IRE, Vol. 48, August 1960, pp. 1418–1423.

The illustrated NDR amplifier includes the Esaki diode 91, a signal source 93, and a load resistance 95. The signal source 93 is comprised of an admittance 93A and a signal current 93B. The Esaki diode 91 and the load resistance 95 are electrically connected to the signal source 93 in cascade. Suppose that an admittance measured when viewed from an interface 3a–3b between the Esaki diode 91 and the signal source 93 to the signal source 93 is defined by (gs1+j×bs1), and that an admittance measured when viewed from the interface 3a–3b to the load resistance 95 is defined by (−gi1+j×bi1) wherein gi1 is positive (gi1>0), the illustrated NDR amplifier has an available gain defined by the following equation (A).

$$\text{Gav} = gs1/(gs1 - gi1) \quad (A)$$

Hence, a significantly high gain can be obtained when (gs1−gi1) approaches 0 from the upper side.

In the above mentioned NDR amplifier employing the Esaki diode, the input terminal in the Esaki diode doubles as the output terminal. Accordingly, the NDR amplifier has no signal-unilaterality, and thus has a problem of, for instance, being likely to be unsteady and thus oscillate when the Esaki diodes are electrically connected in a cascade.

SUMMARY OF THE INVENTION

In view of the foregoing problem of the conventional NDR amplifier, it is an object of the present invention to provide a negative differential resistance amplifier which is excellent in unilaterality in signal and is capable of providing higher gain, lower noise, and wider band.

To this end, there is provided a negative differential resistance amplifier including a negative differential resistance transistor having negative input conductance by utilizing resonant tunneling effect, and which is electrically connected to a signal source circuit in cascade, the following relation being established in the negative differential resistance amplifier:

$$0 < gs - gi < G.$$

Here, gs (gs>0) indicates a conductance measured when viewed from an interface between the negative differential resistance transistor and the signal source circuit to the signal source circuit, −gi (gi>0) indicates an input conductance of the negative differential resistance transistor, and G (G<gs) indicates a predetermined conductance.

These days, research and development is being made on resonant tunneling diode (hereinafter, referred to as "RTD") and resonant tunneling transistor (hereinafter, referred to as "RTT") both utilizing NDR caused by resonant tunneling effect taking place through the electron sub-band in a quantum well. For instance, Japanese Unexamined Patent Publication No. 5-259533 has suggested "Electronic device having characteristic of resonant tunneling effect", Japanese Unexamined Patent Publication No. 63-288061 has suggested "Semiconductor negative differential resistance device", Japanese Unexamined Patent Publication No. 63-258076 has suggested "Vertical field effect transistor", and Japanese Unexamined Patent Publication No. 62-205658 has suggested "High-speed operation semiconductor device".

The devices or transistors suggested in the above identified publications use RTT in a normal amplification mode of a transistor when they use RTT as a high frequency amplifier, and do not utilize the amplification function among the characteristics of NDR, based on resonant tunneling effect.

The NDR amplifier in accordance with the present invention accomplishes high frequency amplification by utilizing NDR characteristics based on the resonant tunneling effect, and further overcomes problems in a conventional NDR amplifier employing the Esaki diode by newly adopting a concept of an amplifier including a transistor having negative input conductance. Specifically, it is possible to provide a gain to an input circuit of RTT by setting appropriate matching conditions between a signal source circuit and RTT biased in a negative input conductance region. Output signals are designed to be transmitted through an output terminal of RTT. A structure as mentioned above provides excellent signal-unilaterality since an input terminal is separately formed from an output terminal, and further provides higher gain, lower noise, and wider band based on the principle mentioned hereinbelow.

As mentioned above, the NDR transistor is electrically connected to the signal source circuit in cascade in the NDR amplifier in accordance with the invention. The available gain Gav is defined by the equation Gav=gs/(gs−gi). Thus, when (gs−gi) is positive and sufficiently smaller than G, there can be obtained a high available gain. Thus, the invention uses a negative differential resistance transistor to thereby utilize the amplification function based on the resonant tunneling effect, and ensures signal-unilaterality by the fact that input and output are separately formed in the negative differential resistance transistor.

The negative differential resistance amplifier may further include an input matching circuit electrically connected to the signal source circuit in cascade. The negative differential resistance amplifier may further include an output matching circuit electrically connected to output ports of the negative differential resistance transistor.

There is further provided a negative differential resistance amplifier including a negative differential resistance transistor having negative input conductance by utilizing resonant tunnel effect which is electrically connected to a signal source circuit in cascade, the following relation being established in the negative differential resistance amplifier:

$$0 < gs - gi < G$$

wherein gs (gs>0) indicates a conductance measured when viewed from an interface between the negative differential resistance transistor and the signal source circuit to the signal source circuit, −gi (gi>0) indicates an input conductance of the negative differential resistance transistor, and G (G<gs) indicates a predetermined conductance, the negative differential resistance transistor being constructed of a combination of a field effect transistor structure and a resonant tunneling diode structure.

By constructing the NDR transistor of a combination of field effect transistor structure and a resonant tunneling diode structure, the NDR transistor would be readily fabricated.

Specifically, the field effect transistor structure may be fabricated so that it includes a channel region and a source electrode between which the resonant tunneling diode is formed. A source electrode of the field effect transistor structure may be electrically connected to a first contact region of the resonant tunneling diode structure, and a gate electrode of the field effect transistor structure may be electrically connected to a second contact region of the resonant tunneling diode structure. The field effect transistor structure may be fabricated so that it includes a channel region and a gate electrode which are electrically connected to each other through the resonant tunneling diode structure. These are fabricated in a semiconductor fabrication process.

There is still further provided a negative differential resistance amplifier including a negative differential resistance transistor having negative input conductance by utilizing resonant tunnel effect which transistor is electrically connected to a signal source circuit in cascade, the following relation being established in the negative differential resistance amplifier:

$$0 < gs - gi < G$$

wherein gs (gs>0) indicates a conductance measured when viewed from an interface between the negative differential resistance transistor and the signal source circuit to the signal source circuit, -gi (gi>0) indicates a conductance of the negative differential resistance transistor, and G (G<gs) indicates a predetermined conductance, the negative differential resistance transistor being constructed of a combination of a bipolar transistor structure and a resonant tunneling diode structure.

By constructing the NDR transistor of a combination of bipolar transistor structure and a resonant tunneling diode structure, the NDR transistor could be readily fabricated.

Specifically, the bipolar transistor structure may be fabricated so that it includes a base region and an emitter electrode which are electrically connected to each other through the resonant tunneling diode structure. An emitter electrode of the bipolar transistor structure may be electrically connected to a first contact region of the resonant tunneling diode structure, and a base electrode of the bipolar transistor structure may be electrically connected to a second contact region of the resonant tunneling diode structure. The bipolar transistor structure may be fabricated so that it includes a base region and a base electrode which are electrically connected to each other through the resonant tunneling diode structure.

In the above mentioned negative differential resistance amplifier, epilayer parameters of the resonant tunneling diode structure may be chosen to lower a ratio of a current to a negative differential conductance in the negative differential resistance amplifier.

For RTD structures, the ratio of a current to a negative difference conductance may be varied controllably to some degree, and hence it would be possible to lower noises.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
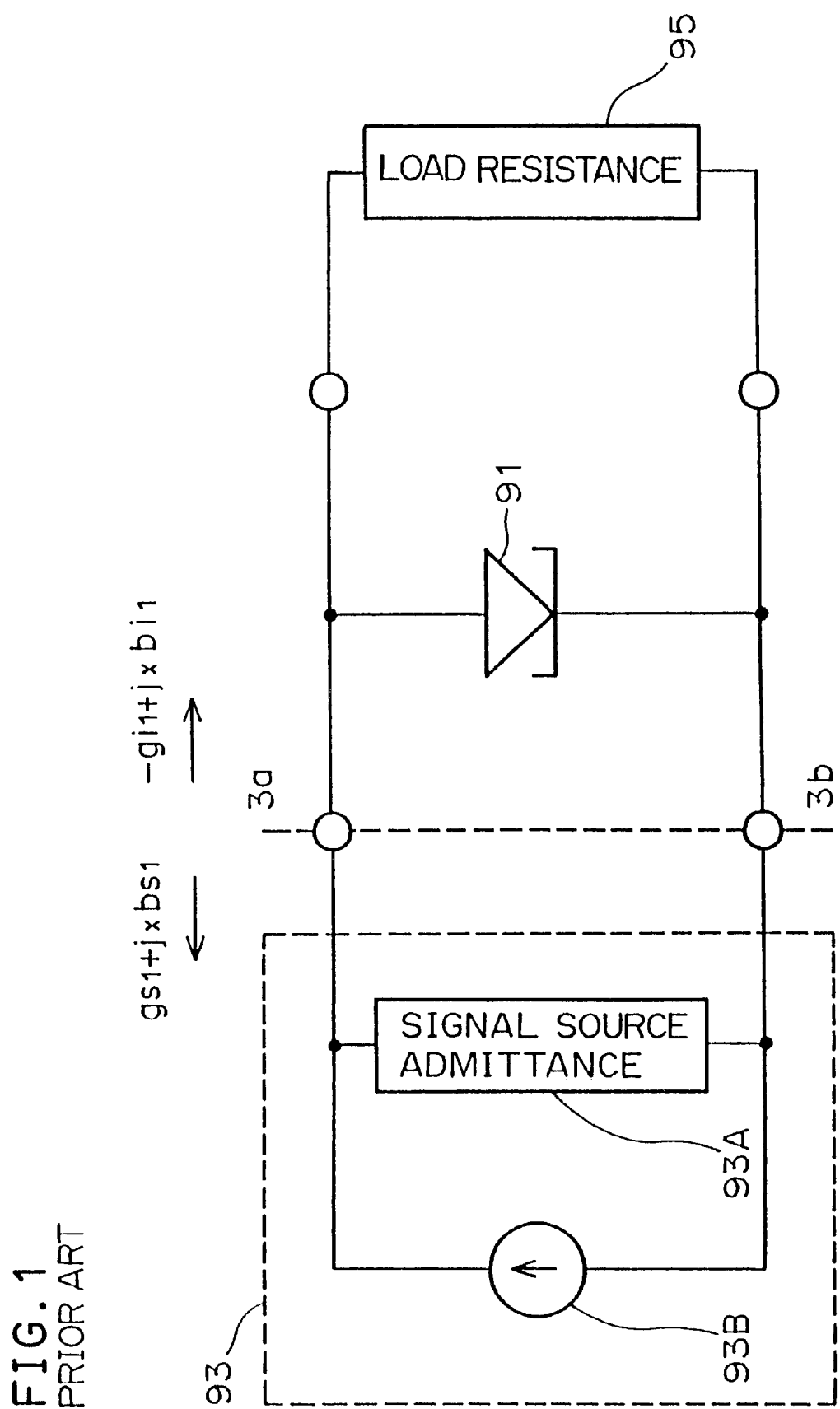
FIG. 1 is a circuit diagram of a conventional negative differential resistance amplifier.
Figure 2A:
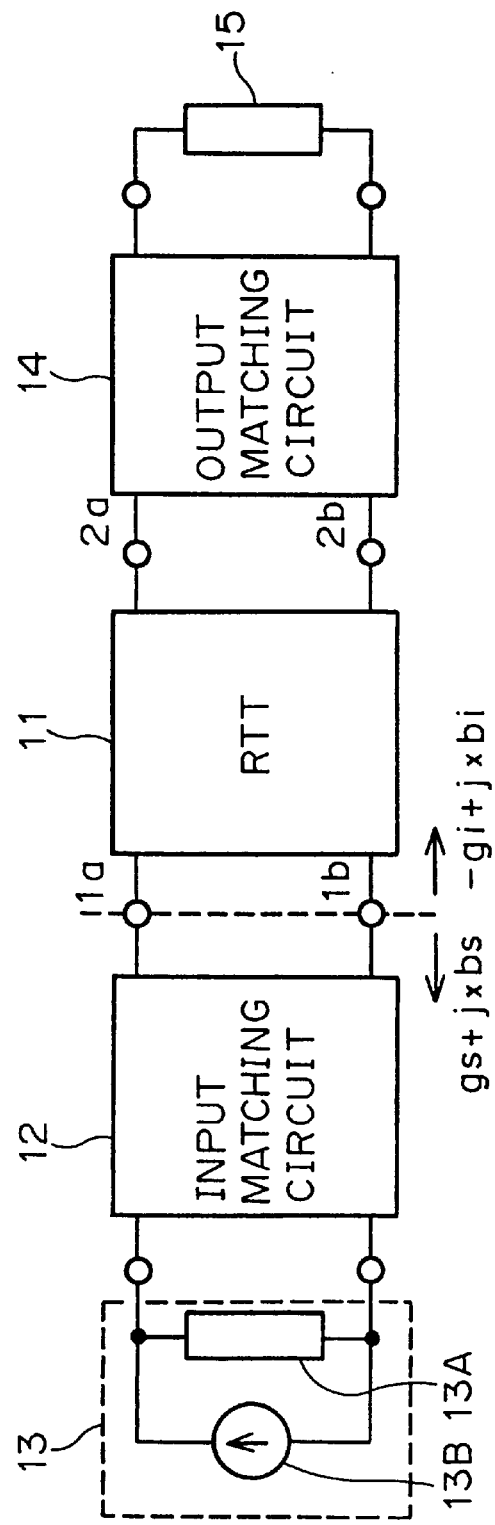
FIG. 2A is a circuit diagram of a negative differential resistance amplifier in accordance with the first embodiment of the present invention.

FIG. 2A is a circuit diagram illustrating a negative differential (NDR) amplifier in accordance with the first embodiment. A resonant tunneling transistor (RTT) 11 having a negative input conductance is electrically connected at input terminals 1a and 1b thereof to a signal source circuit 13 in cascade through an input matching circuit 12, and further is electrically connected at output terminals 2a and 2b thereof to a load resistance 15 through an output matching circuit 14. The signal source circuit 13 is comprised of a signal source admittance 13A and a signal current source 13B. The RTT 11 is designed to have a biasing point by which the input conductance is negative, and, under that condition, suppose that RTT 11 has an input admittance defined by (−gi+j×bi) where gi is positive (gi>0), and that an admittance measured when viewed from the input terminals 1a and 1b to the signal source circuit 13 is defined by (gs+j×bs).

Figure 2B:
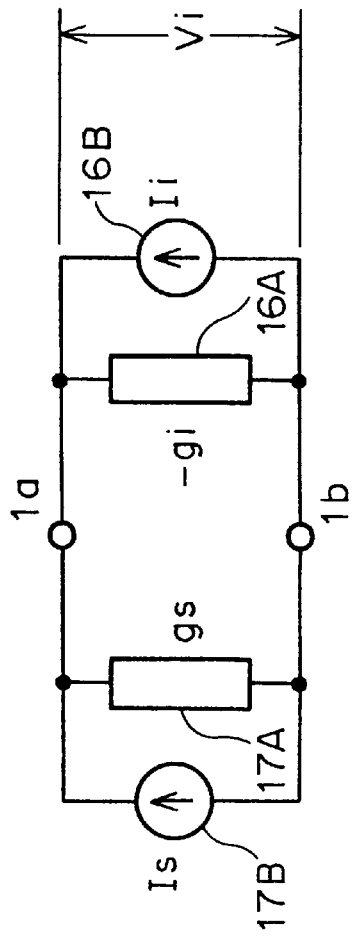
FIG. 2B is a circuit diagram of a circuit equivalent to an input section of the circuit illustrated in FIG. 2A.

Since reactance elements are cancelled with each other in resonance, an input section of the illustrated circuit is equivalent to a simplified circuit illustrated in FIG. 2B. That is, an input conductance (−gi) 16A and noise currents (Ii) generated at the input terminals of RTT 11 are connected to the input terminals 1a and 1b at the side of load resistance, and a conductance (gs) 17A and a signal source (Is) 17B are connected to the input terminals 1a and 1b at the side of a signal source.

In the NDR amplifier having the above mentioned structure, if the relation gs>gi is established, it is possible to amplify a power, in which case an available gain is represented with the following equation (B).

$$Gav = gs/(gs-gi) \tag{B}$$

Accordingly, the available gain becomes infinite when (gs−gi) approaches 0 (zero) from the upper side, and thus noises generated at the outputs of RTT 11 can be completely disregarded. A condition for the gain to be equal to 10 dB is (gs−gi)=gs/10. Namely, if the gain should be equal to or greater than 10 dB, (gs−gi) has to be equal to or smaller than gs/10. After all, the following relation is led from the foregoing discussion.

$$0 < (gs-gi) < G \quad (G=gs/10)$$

The NDR amplifier in accordance with the present invention accomplishes this relation by utilizing an NDR transistor.

In order to accomplish the above mentioned relation, there may be disposed an input matching circuit, as well as an NDR transistor, between a signal source circuit and an NDR transistor as illustrated in FIG. 2A, and there may be disposed an output matching circuit at outputs of an NDR transistor as illustrated in FIG. 2A.

As mentioned earlier, input and output terminals of the NDR amplifier are separately formed by utilizing an NDR transistor, and signals are scarcely transmitted from the outputs to the inputs. Thus, excellent signal-unilaterality is provided which ensures stable operation of amplification.

In order to inspect noise characteristic of the NDR amplifier in accordance with the instant embodiment, the signal source 17B in FIG. 2B is considered to be noise current (Is) originated from the signal source 13. Since noises generated at the outputs of RTT 11 can be completely disregarded when the gain is maximized, noise figure (NF) is represented with the following equation (C):

$$NF = 1 + <Ii^2>/<Is^2> \tag{C}$$

wherein $<Ii^2>$ and $<Is^2>$ indicate mean square value of noise currents Ii and Is, respectively. The noise current Ii generated at the input terminals of RTT 11 has, as a main element, shot noise which are generated when electrons pass through an RTD structure which is a part of RTT 11. According to the theory about shot noise, $<Ii^2>$ is defined by the following equation (D):

$$<Ii^2> = 2 \times q \times Id \times \Delta f \tag{D}$$

wherein q indicates an electric charge of an electron, Id indicates DC current flowing through the RTD structure, and Δf indicates a frequency width.

On the other hand, since noises originated from the signal source are thermal noises, $<Is^2>$ is defined by the following equation (E) according to Nyquist's theory:

$$<Is^2> = 4 \times k \times T \times gs \times \Delta f \tag{E}$$

wherein k indicates Boltzman's constant, and T indicates an ambient temperature.

Introducing the equations (D) and (E) into the equation (C), noise figure NF∞ when the gain is maximized is represented with the following equation (F).

$$NF\infty = 1 + q \times Id/(2 \times k \times T \times gi) \tag{F}$$

Since frequency distribution of gi can be disregarded in a range of frequency sufficiently smaller than a maximum oscillation frequency ($f_{max}$), it is found that the noise figure NF has a small dependency on frequency. This is because frequency spectrum of shot noise is white in color. In the NDR amplifier in accordance with the present invention, the dependency of NF on frequency is quite flat.

If an undoped spacer layer is introduced into an RTD structure, a barrier capacitance is lowered, resulting in that a maximum oscillation frequency ($f_{max}$) of a couple of hundreds GHz or greater can be obtained. Hence, a band could be readily made broader in the NDR amplifier in accordance with the invention.

In view of the above mentioned equation (F), it is found out that a ratio of a current to a negative conductance (Id/gi) in the RTD structure needs to be lowered in order to enhance noise characteristics of the NDR amplifier. This is the same way as that of a conventional Esaki diode amplifier. However, since a ratio of a current to a negative conductance ratio (Ied/$g_{ED}$) in the Esaki diode is dependent on material of which the diode is made, it was difficult to lower the ratio in the conventional Esaki diode amplifier. On the other hand, a (Id/gi) ratio may be varied controllably to some degree in the RTD structure by varying a parameter on epitaxial structure thereof, such as a film thickness and composition of a quantum well layer and a barrier layer, and it is possible to further lower noises of the NDR amplifier.

Figure 3A:
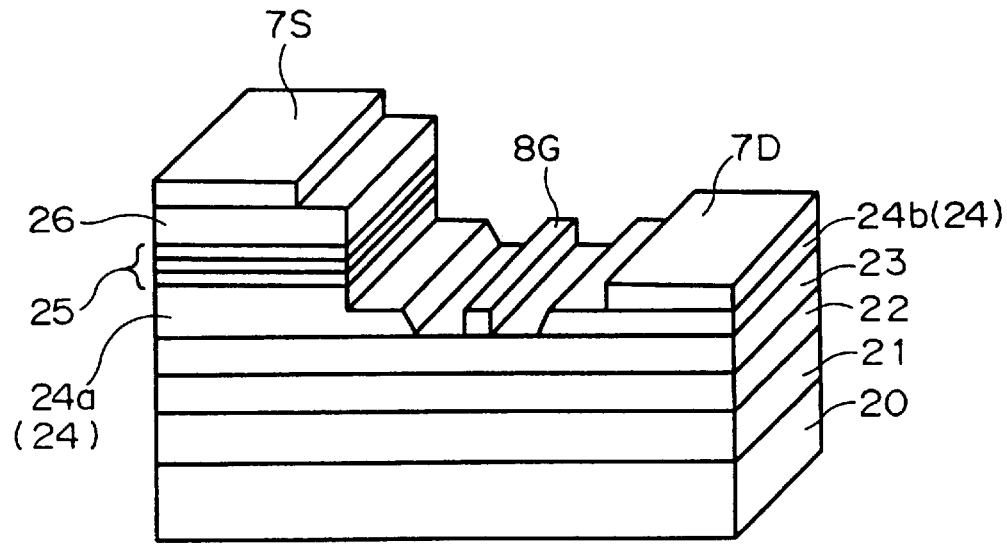
FIG. 3A is a perspective view illustrating a structure of a negative differential resistance transistor used for a negative differential resistance amplifier in accordance with the second embodiment of the invention.
Figure 3B:
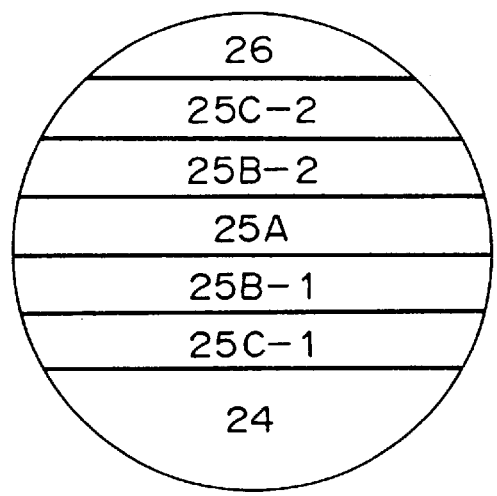
FIG. 3B is a schematic view illustrating a structure of RTD in the transistor illustrated in FIG. 3A.
Figure 3C:
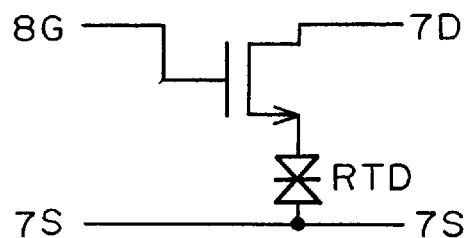
FIG. 3C is a circuit diagram of a circuit including RTD illustrated in FIG. 3B, disposed between a channel region and a source electrode of a field effect transistor.

FIGS. 3A to 3C illustrate a first example of RTT employed in the NDR amplifier in accordance with the present invention. As illustrated in FIG. 3A, the NDR amplifier includes a semi-insulating GaAs substrate 20, an undoped GaAs buffer layer 21 formed on the substrate 20, an undoped InGaAs channel layer 22 formed on the undoped GaAs buffer layer 21, an n-type AlGaAs electron supplying layer 23 formed on the undoped InGaAs channel layer 22, an n-type GaAs cap layers 24a and 24b formed partially on the n-type AlGaAs electron supplying layer 23, a RTD structure 25 formed on the n-type GaAs cap layer 24a, an n-type GaAs contact layer 26 formed on the RTD structure 25, a drain electrode 7D formed on the n-type GaAs cap layer 24b, a source electrode 7S formed on the n-type GaAs contact layer 26, and a gate electrode 8G formed on the n-type AlGaAs electron supplying layer 23.

As illustrated in FIG. 3B, the RTD structure 25 is comprised of a multi-layer structure including a first undoped GaAs spacer layer 25C-1 formed on the n-type GaAs cap layer 24, a first undoped AlAs quantum barrier layer 25B-1 formed on the first undoped GaAs spacer layer 25C-1, an undoped GaAs quantum well layer 25A formed on the first undoped AlAs quantum barrier layer 25B-1, a second undoped AlAs quantum barrier layer 25B-2 formed on the undoped GaAs quantum well layer 25A, and a second undoped GaAs spacer layer 25C-2 formed on the second undoped AlAs quantum barrier layer 25B-2.

The RTT is equivalent to a circuit illustrated in FIG. 3C, which has RTD disposed between a channel region and a source electrode of a field effect transistor (FET), and exhibits a negative input conductance based on the resonant tunneling effect of electrons.

The RTT is fabricated as follows. The following layers are made grown in this order and by a thickness indicated, on the (100) semi-insulating GaAs substrate 20, for instance, by means of molecular beam epitaxy (MBE).

1. Undoped GaAs layer 21: 500 nm
2. Undoped $In_{0.2}Ga_{0.8}As$ layer 22: 20 nm
3. N-type $Al_{0.2}Ga_{0.8}As$ layer 23 having an impurity concentration of $2\times10^{18}$ cm$^{-3}$: 40 nm
4. N-type GaAs layer 24 having an impurity concentration of $5\times10^{18}$ cm$^{-3}$: 200 nm
5. Undoped GaAs layer 25C-1: Ls (=0, 5, 10, 20 or 40 nm)
6. Undoped AlAs layer 25B-1: 2 nm
7. Undoped GaAs layer 25A: 5 nm
8. Undoped AlAs layer 25B-2: 2 nm
9. Undoped GaAs layer 25C-2: 5 nm
10. N-type GaAs layer 26 having an impurity concentration of $5\times10^{18}$ cm$^{-3}$: 80 nm Then, the epitaxial layer structure is partially etched for removal until the n-type GaAs cap layer 24 is partially etched in a thickness-wise direction, to thereby form a mesa of the RTD structure 25. Then, a resultant is etched until the undoped GaAs buffer layer 21 appears, to thereby form a mesa of device isolation region.

Then, metal such as AuGe/Ni/Au is evaporated both on the n-type GaAs cap layer 24b and the n-type GaAs contact layer 26 formed on the RTD mesa to thereby form the drain electrode 7D and the source electrode 7S, respectively.

Then, there is formed a recess in a region between the source electrode 7S and the drain electrode 7D by partially etching the epitaxial layer structure until the n-type AlGaAs electron supplying layer 23 appears. Then, metal such as Ti/Pt/Au is evaporated on the exposed surface of the n-type AlGaAs electron supplying layer 23 to thereby form the gate electrode 8G. Thus, there is completed RTT as illustrated in FIG. 3A.

In the instant embodiment, the source electrode 7S of the thus completed RTT is grounded, input signals are introduced into the gate electrode 8G, and output signals are taken out through the drain electrode 7D. That is, the NDR amplifier is fabricated by electrically connecting the grounding terminals 1b and 2b to the source electrode 7S, the input signal terminal 1a to the gate electrode 8G, and the output signal terminal 2a to the drain electrode 7D in FIG. 2A.

Figure 4:
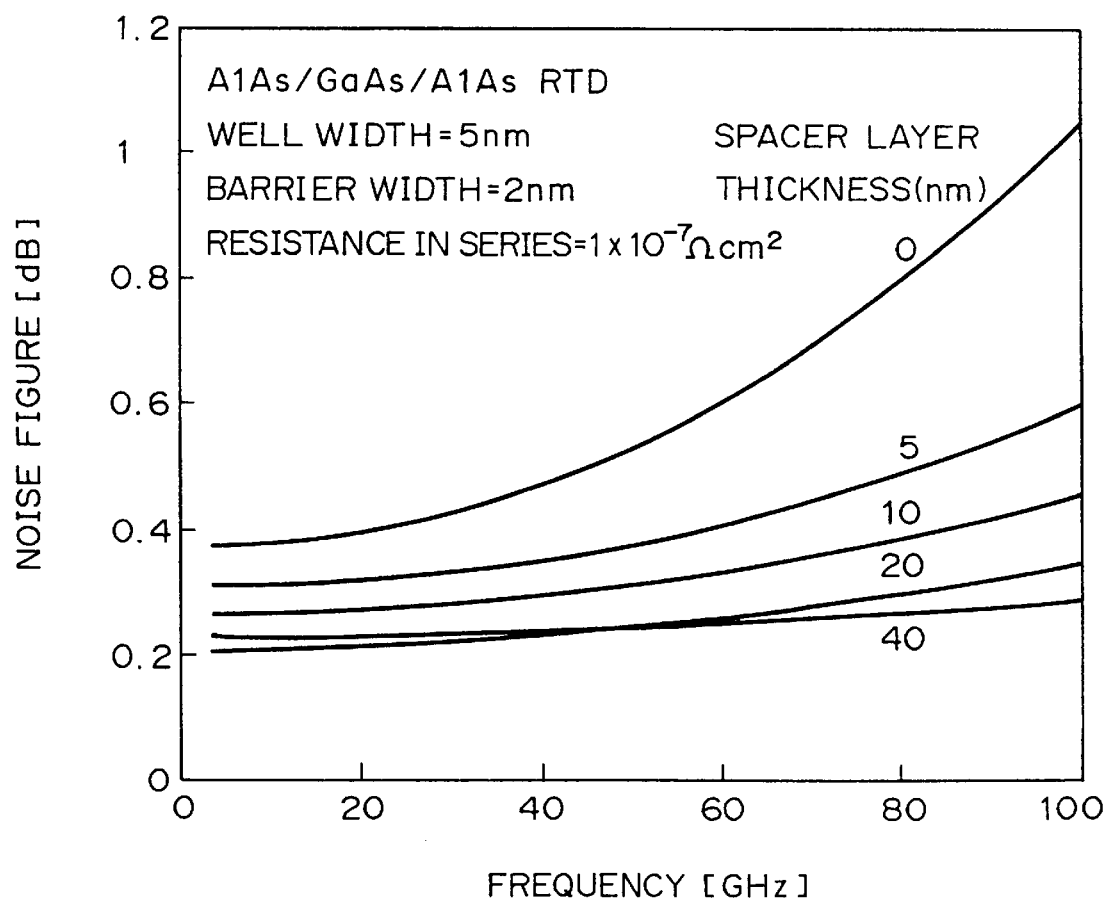
FIG. 4 is a graph showing the dependency of noise figure of a negative differential resistance amplifier in accordance with the present invention on frequency.

FIG. 4 shows the dependency of NF calculated in the thus completed NDR amplifier on frequency. It is understood that the dependency of NF on frequency is quite flat, and that NF is improved as the undoped GaAs spacer layer 25C has a greater thickness Ls. In particular, when Ls is equal to or greater than 20 nm (Ls≧20 nm), NF is smaller than 0.3 dB at 100 GHz. Thus, there can be obtained noise characteristic superior to that of conventional Esaki diode amplifier and FET amplifier.

Figure 5A:
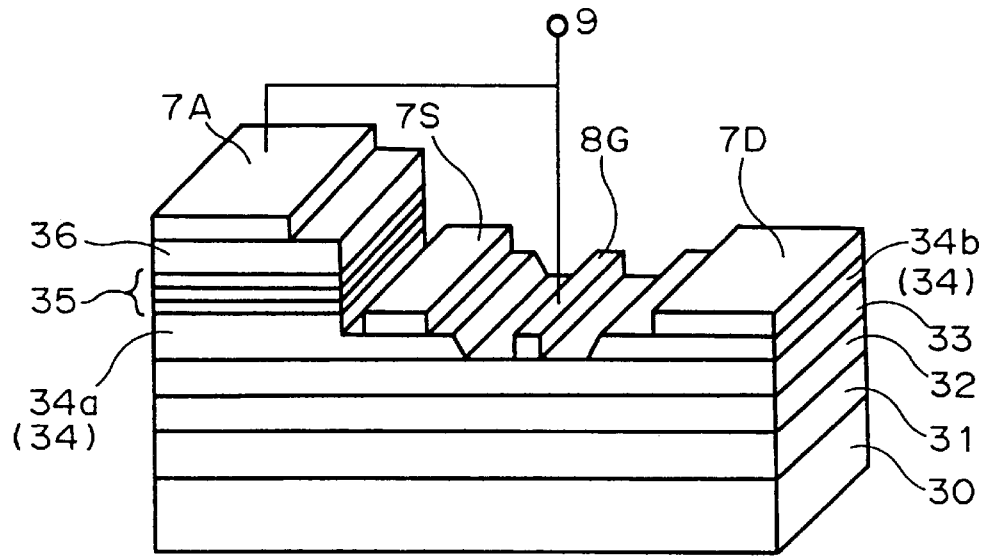
FIG. 5A is a perspective view illustrating a structure of a negative differential resistance transistor used for a negative differential resistance amplifier in accordance with the third embodiment of the invention.
Figure 5B:
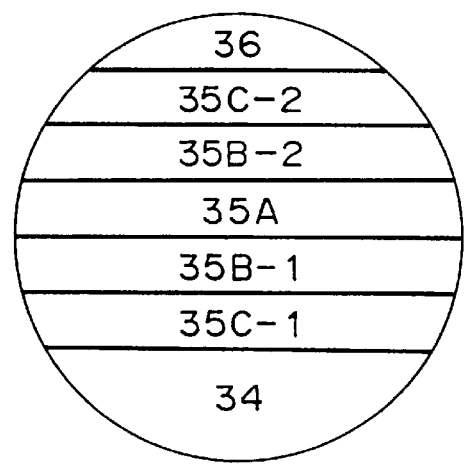
FIG. 5B is a schematic view illustrating a structure of RTD in the transistor illustrated in FIG. 5A.
Figure 5C:
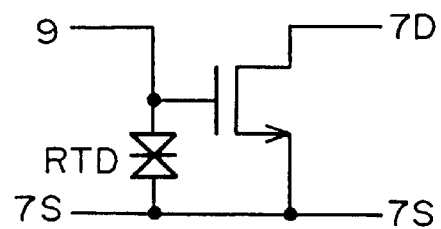
FIG. 5C is a circuit diagram of a circuit including RTD illustrated in FIG. 5B, disposed between a gate electrode and a source electrode of a field effect transistor.

FIGS. 5A to 5C illustrate a second example of RTT employed in the NDR amplifier in accordance with the present invention. As illustrated in FIG. 5A, the NDR amplifier includes a semi-insulating InP substrate 30, an undoped InAlAs buffer layer 31 formed on the substrate 30, an undoped InGaAs channel layer 32 formed on the undoped InAlAs buffer layer 31, an n-type InAlAs electron supplying layer 33 formed on the undoped InGaAs channel layer 32, an n-type InGaAs cap layers 34a and 34b formed partially on the n-type InAlAs electron supplying layer 33, a RTD structure 35 formed on the n-type InGaAs cap layer 34a, an n-type InGaAs contact layer 36 formed on the RTD structure 35, drain and source electrodes 7D and 7S formed on the n-type InGaAs cap layer 34b and 34a, respectively, an ohmic electrode 7A formed on the n-type InGaAs contact layer 36, and a gate electrode 8G formed on the n-type InAlAs electron supplying layer 33. The gate electrode 8G is in electrical communication with the ohmic electrode 7A, both of which are electrically connected to an input terminal 9.

As illustrated in FIG. 5B, the RTD structure 35 is comprised of a multi-layer structure including a first undoped InGaAs spacer layer 35C-1 formed on the n-type InGaAs cap layer 34, a first undoped AlAs quantum barrier layer 35B-1 formed on the first undoped InGaAs spacer layer 35C-1, an undoped InGaAs quantum well layer 35A formed on the first undoped AlAs quantum barrier layer 35B-1, a second undoped AlAs quantum barrier layer 35B-2 formed on the undoped InGaAs quantum well layer 35A, and a second undoped InGaAs spacer layer 35C-2 formed on the second undoped AlAs quantum barrier layer 35B-2.

The RTT is equivalent to a circuit illustrated in FIG. 5C, which has RTD disposed in parallel between a gate electrode and a source electrode of a field effect transistor (FET), and exhibits a negative input conductance based on the resonant tunneling effect of electrons.

In the instant embodiment, the source electrode 7S of the thus completed RTT is grounded, input signals are introduced into the input terminal 9, and output signals are taken out through the drain electrode 7D. That is, the NDR amplifier is fabricated by electrically connecting the grounding terminals 1b and 2b to the source electrode 7S, the input signal terminal 1a to the input terminal 9, and the output signal terminal 2a to the drain electrode 7D in FIG. 2A.

Figure 6A:
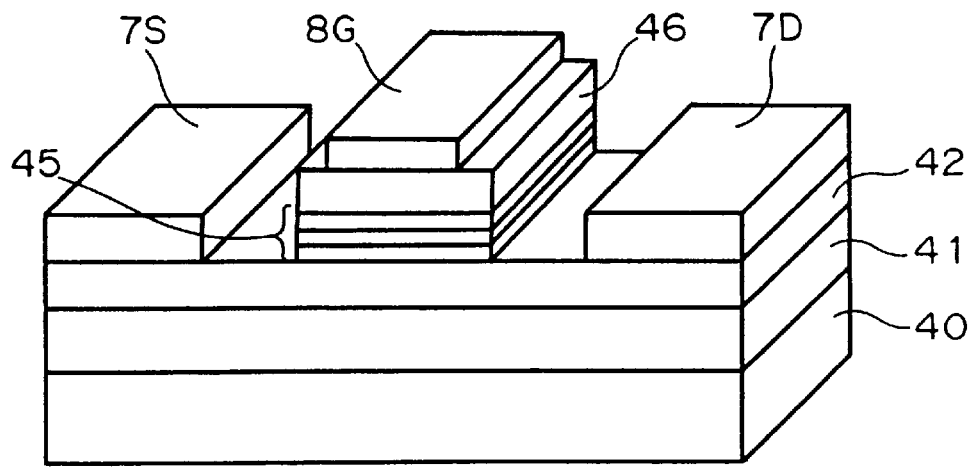
FIG. 6A is a perspective view illustrating a structure of a negative differential resistance transistor used for a negative differential resistance amplifier in accordance with the fourth embodiment of the invention.
Figure 6B:
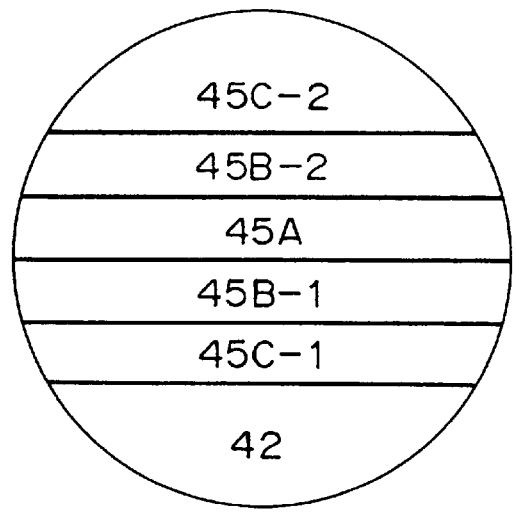
FIG. 6B is a schematic view illustrating a structure of RTD in the transistor illustrated in FIG. 6A.
Figure 6C:
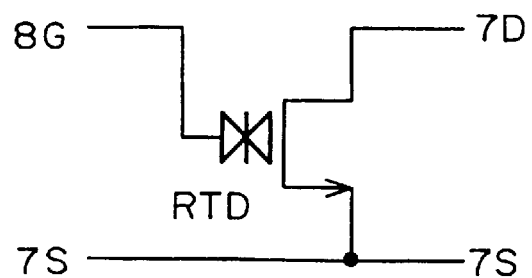
FIG. 6C is a circuit diagram of a circuit including RTD illustrated in FIG. 6B, disposed between a gate electrode and a channel region of a field effect transistor.

FIGS. 6A to 6C illustrate a third example of RTT employed in the NDR amplifier in accordance with the present invention. As illustrated in FIG. 6A, the NDR amplifier includes a semi-insulating GaAs substrate 40, an undoped InAs/GaAs superlattice buffer layer 41 formed on the substrate 40, an n-type InAs channel layer 42 formed on the undoped InAs/GaAs superlattice buffer layer 41, a RTD structure 45 formed on the n-type InAs channel layer 42, an undoped InAs Schottky layer 46 formed on the RTD structure 45, source and drain electrodes 7S and 7D formed on the n-type InAs channel layer 42, and a gate electrode 8G formed on the undoped InAs Schottky layer 46.

As illustrated in FIG. 6B, the RTD structure 45 is comprised of a multi-layer structure including a first undoped InAs spacer layer 45C-1 formed on the n-type InAs channel layer 42, a first undoped AlSb quantum barrier layer 45B-1 formed on the first undoped InAs spacer layer 45C-1, an undoped InAs quantum well layer 45A formed on the first undoped AlSb quantum barrier layer 45B-1, a second undoped AlSb quantum barrier layer 45B-2 formed on the undoped InAs quantum well layer 45A, and a second undoped InAs spacer layer 45C-2 formed on the second undoped AlSb quantum barrier layer 45B-2.

The RTT is equivalent to a circuit illustrated in FIG. 6C, which has RTD disposed between a gate electrode and a channel region of a field effect transistor (FET). When a voltage is applied to the gate electrode 8G, the RTT modulates a concentration of electrons accumulated at an interface between the RTD structure 45 and the n-type InAs channel layer 42, and exhibits a negative input conductance based on the resonant tunneling effect of electrons in the RTD structure 45.

When a gate electrode makes ohmic contact with a RTD structure, a current flows between a gate and a drain, as well as between a gate and a source, due to non-rectification of RTD, resulting in increased feedback, which deteriorates the signal-unilaterality. To solve this problem, the instant embodiment designs the RTD structure 45 to make Schottky contact with the gate electrode 8G through the undoped InAs Schottky layer 46. Thus, a current flows through the RTD structure 45 only when a positive voltage is applied to the gate, ensuring rectification.

In the instant embodiment, the source electrode 7S of the RTT is grounded, input signals are introduced into the gate electrode 8G, and output signals are taken out through the drain electrode 7D. That is, the NDR amplifier is fabricated by electrically connecting the grounding terminals 1*b* and 2*b* to the source electrode 7S, the input signal terminal 1*a* to the gate electrode 8G, and the output signal terminal 2*a* to the drain electrode 7D in FIG. 2A.

Figure 7A:
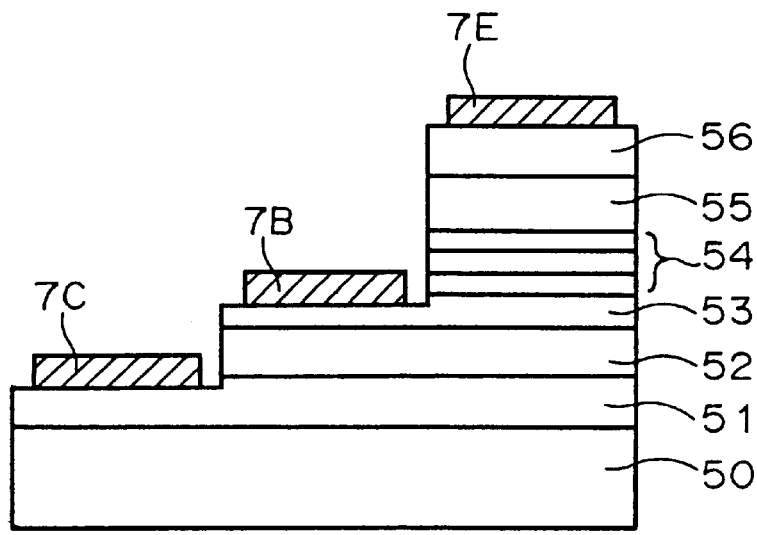
FIG. 7A is a perspective view illustrating a structure of a negative differential resistance transistor used for a negative differential resistance amplifier in accordance with the fifth embodiment of the invention.
Figure 7B:
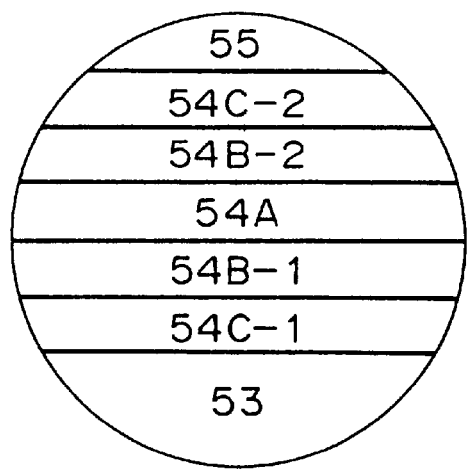
FIG. 7B is a schematic view illustrating a structure of RTD in the transistor illustrated in FIG. 7A.
Figure 7C:
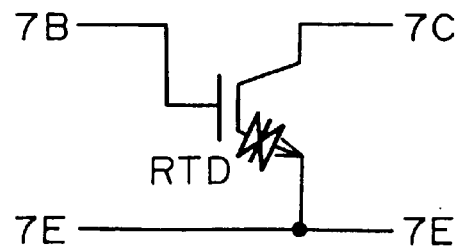
FIG. 7C is a circuit diagram of a circuit including RTD illustrated in FIG. 7B, disposed between a base region and an emitter electrode of a hetero-junction bipolar transistor.

FIGS. 7A to 7C illustrate a fourth example of RTT employed in the NDR amplifier in accordance with the present invention. As illustrated in FIG. 7A, the NDR amplifier includes a semi-insulating GaAs substrate 50, an n-type GaAs sub-collector layer 51 formed on the substrate 50, an n-type GaAs collector layer 52 formed on the n-type GaAs sub-collector layer 51, a p-type GaAs base layer 53 formed on the n-type GaAs collector layer 52, a RTD structure 54 formed on the p-type GaAs base layer 53, an n-type AlGaAs emitter layer 55 formed on the RTD structure 54, an n-type GaAs cap layer 56 formed on the n-type AlGaAs emitter layer 55, an emitter electrode 7E formed on the n-type GaAs cap layer 56, a base electrode 7B formed on the p-type GaAs base layer 53, and a collector electrode 7C formed on the n-type GaAs sub-collector layer 51. The n-type GaAs sub-collector layer 51 has a partially exposed surface, on which the collector electrode 7C is formed. Similarly, the p-type GaAs base layer 53 has a partially exposed surface, on which the base electrode 7B is formed.

As illustrated in FIG. 7B, the RTD structure 54 is comprised of a multi-layer structure including a first undoped GaAs spacer layer 54C-1 formed on the p-type GaAs base layer 53, a first undoped AlAs quantum barrier layer 54B-1 formed on the first undoped GaAs spacer layer 54C-1, an undoped GaAs quantum well layer 54A formed on the first undoped AlAs quantum barrier layer 54B-1, a second undoped AlAs quantum barrier layer 54B-2 formed on the undoped GaAs quantum well layer 54A, and a second undoped GaAs spacer layer 54C-2 formed on the second undoped AlAs quantum barrier layer 54B-2.

The RTT is equivalent to a circuit illustrated in FIG. 7C, which has RTD disposed between a base region and an emitter region of an n-p-n hetero-junction bipolar transistor (hereinafter, referred to as "HBT"), and exhibits a negative input conductance based on the resonant tunneling effect of electrons.

The RTT is fabricated as follows. The following layers are made grown in this order and by a thickness indicated, on the (100) semi-insulating GaAs substrate 50, for instance, by means of MBE.

1. N-type GaAs layer 51 having an impurity concentration of $5 \times 10^{18}$ cm$^{-3}$: 300 nm
2. N-type GaAs layer 52 having an impurity concentration of $3 \times 10^{16}$ cm$^{-3}$: 200 nm
3. P-type GaAs layer 53 having an impurity concentration of $2 \times 10^{19}$ cm$^{-3}$: 50 nm
4. Undoped GaAs layer 54C-1: 20 nm
5. Undoped AlAs layer 54B-1: 2 nm
6. Undoped GaAs layer 54A: 5 nm
7. Undoped AlAs layer 54B-2: 2 nm
8. Undoped GaAs layer 54C-2: 5 nm
9. N-type Al$_{0.2}$Ga$_{0.8}$As layer 55 having an impurity concentration of $1 \times 10^{18}$ cm$^{-3}$: 200 nm
10. N-type GaAs layer 56 having an impurity concentration of $5 \times 10^{18}$ cm$^{-3}$: 200 nm Then, the epitaxial layer structure is partially etched for removal until the p-type GaAs base layer 53 is partially etched in a thicknesswise direction, to thereby form a mesa of an emitter. Then, a resultant is etched until the n-type GaAs sub-collector layer 51 appears, to thereby form a mesa of a base.

Then, metal such as Ti/Pt/Au is evaporated both on the n-type GaAs sub-collector layer 51 and the n-type GaAs cap layer 56 formed on the emitter mesa to thereby form the collector electrode 7C and the emitter electrode 7E, respectively.

Then, metal such as Ti/Pt/Au is evaporated on the p-type GaAs base layer 53 situated over the mesa of the base, to thereby form the base electrode 7B. Thus, there is completed RTT as illustrated in FIG. 7A.

In the instant embodiment, the emitter electrode 7E of the thus completed RTT is grounded, input signals are introduced into the base electrode 7B, and output signals are taken out through the collector electrode 7C. That is, the NDR amplifier is fabricated by electrically connecting the grounding terminals 1*b* and 2*b* to the emitter electrode 7E, the input signal terminal 1*a* to the base electrode 7B, and the output signal terminal 2*a* to the collector electrode 7C in FIG. 2A.

Figure 8A:
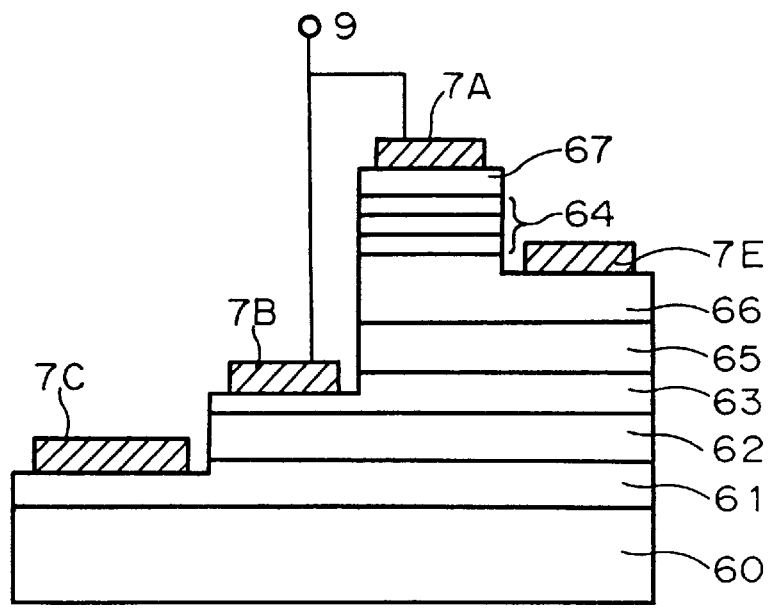
FIG. 8A is a perspective view illustrating a structure of a negative differential resistance transistor used for a negative differential resistance amplifier in accordance with the sixth embodiment of the invention.
Figure 8B:
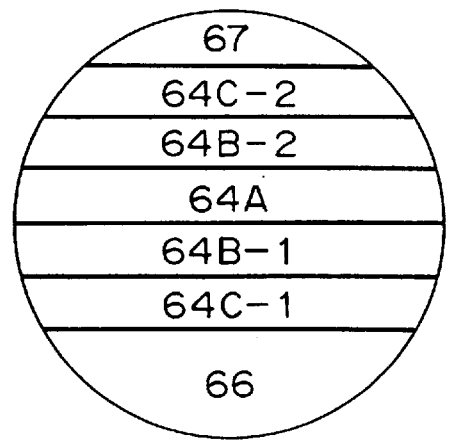
FIG. 8B is a schematic view illustrating a structure of RTD in the transistor illustrated in FIG. 8A.
Figure 8C:
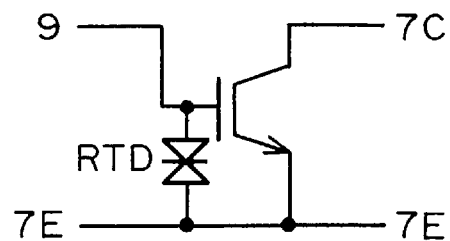
FIG. 8C is a circuit diagram of a circuit including RTD illustrated in FIG. 8B, disposed between a base electrode and an emitter electrode of a hetero-junction bipolar transistor.

FIGS. 8A to 8C illustrate a fifth example of RTT employed in the NDR amplifier in accordance with the present invention. As illustrated in FIG. 8A, the NDR amplifier includes a semi-insulating InP substrate 60, an n-type InGaAs sub-collector layer 61 formed on the substrate 60, an n-type InGaAs collector layer 62 formed on the n-type InGaAs sub-collector layer 61, a p-type InAlGaAs base layer 63 formed on the n-type InGaAs collector layer 62, an n-type InAlAs emitter layer 65 formed on the p-type InAlGaAs base layer 63, an n-type InGaAs cap layer 66 formed on the n-type InAlAs emitter layer 65, a RTD structure 64 formed on the n-type InGaAs cap layer 66, an n-type InGaAs contact layer 67 formed on the RTD structure 64, an emitter electrode 7E formed on the n-type InGas cap layer 66, a base electrode 7B formed on the p-type InAlGaAs base layer 63, a collector electrode 7C formed on the n-type InGaAs sub-collector layer 61, and an ohmic electrode 7A formed on the n-type InGaAs contact layer 67. The n-type InGaAs sub-collector layer 61 has a partially exposed surface, on which the collector electrode 7C is formed. Similarly, the p-type InAlGaAs base layer 63 has a partially exposed surface, on which the base electrode 7B is formed, the n-type InGaAs cap layer 66 has a partially exposed surface, on which the emitter electrode 7E is formed. The base electrode 7B makes electrical communication with the ohmic electrode 7A through a wire, and both the electrodes 7B and 7A are electrically connected to an input terminal 9.

As illustrated in FIG. 8B, the RTD structure 64 is comprised of a multi-layer structure including a first undoped InGaAs spacer layer 64C-1 formed on the n-type InGaAs cap layer 66, a first undoped AlAs quantum barrier layer 64B-1 formed on the first undoped InGaAs spacer layer 64C-1, an undoped InGaAs quantum well layer 64A formed on the first undoped AlAs quantum barrier layer 64B-1, a second undoped AlAs quantum barrier layer 64B-2 formed on the undoped InGaAs quantum well layer 64A, and a second undoped InGaAs spacer layer 64C-2 formed on the second undoped AlAs quantum barrier layer 64B-2.

The RTT is equivalent to a circuit illustrated in FIG. 8C, which has RTD disposed in parallel between a base electrode and an emitter electrode of an n-p-n hetero-junction bipolar transistor, and exhibits a negative input conductance based on the resonant tunneling effect of electrons.

In the instant embodiment, the emitter electrode 7E of the thus completed RTT is grounded, input signals are introduced into the input terminal 9, and output signals are taken out through the collector electrode 7C. That is, the NDR amplifier is fabricated by electrically connecting the grounding terminals 1b and 2b to the emitter electrode 7E, the input signal terminal 1a to the input terminal 9, and the output signal terminal 2a to the collector electrode 7C in FIG. 2A.

Figure 9A:
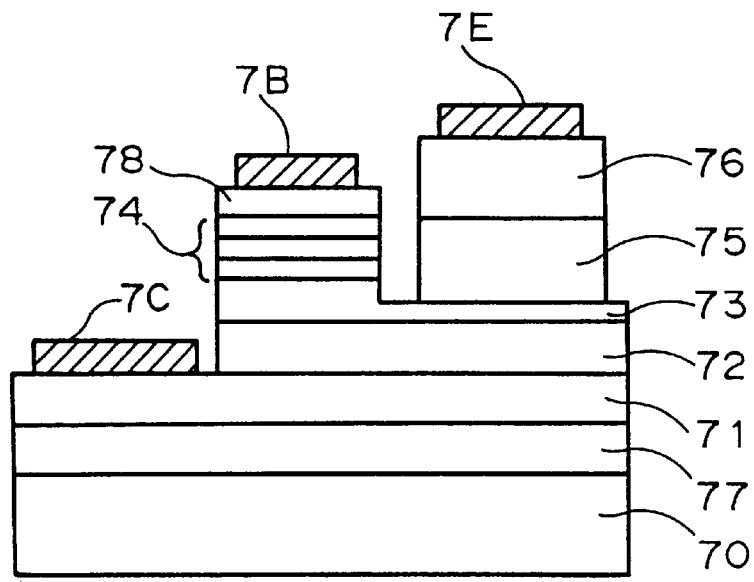
FIG. 9A is a perspective view illustrating a structure of a negative differential resistance transistor used for a negative differential resistance amplifier in accordance with the seventh embodiment of the invention.
Figure 9B:
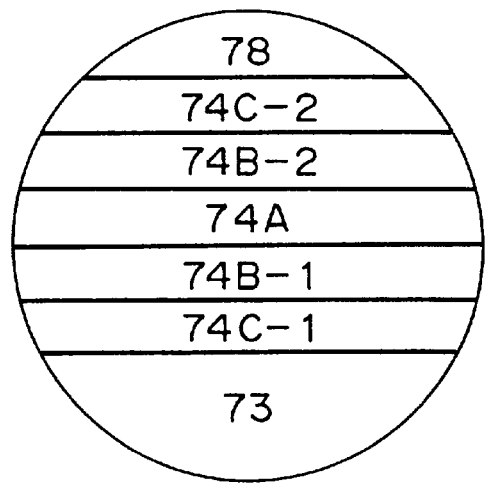
FIG. 9B is a schematic view illustrating a structure of RTD in the transistor illustrated in FIG. 9A.
Figure 9C:
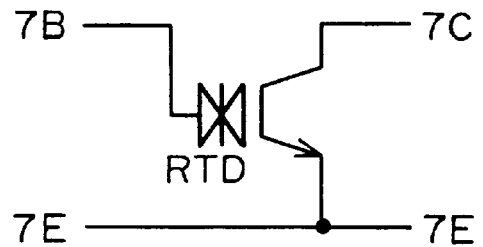
FIG. 9C is a circuit diagram of a circuit including RTD illustrated in FIG. 8B, disposed between a base electrode and a base region of a hetero-junction bipolar transistor.

FIGS. 9A to 9C illustrate a sixth example of RTT employed in the NDR amplifier in accordance with the present invention. As illustrated in FIG. 9A, the NDR amplifier includes a semi-insulating GaAs substrate 70, an undoped InAs/GaAs superlattice buffer layer 77 formed on the substrate 70, an n-type InAs sub-collector layer 71 formed on the undoped InAs/GaAs superlattice buffer layer 77, a n-type InAs collector layer 72 formed on the n-type InAs sub-collector layer 71, a p-type InAs base layer 73 formed on the n-type InAs collector layer 72, a RTD structure 74 formed on the p-type InAs base layer 73, a p-type InAs contact layer 78 formed on the RTD structure 74, an n-type InGaAs emitter layer 75 formed on a partially exposed surface of the p-type InAs base layer 73, an n-type InAs cap layer 76 formed on the n-type InGaAs emitter layer 75, an emitter electrode 7E formed on the n-type InAs cap layer 76, a base electrode 7B formed on the p-type InAs contact layer 78, and a collector electrode 7C formed on the n-type InAs sub-collector layer 71.

As illustrated in FIG. 9B, the RTD structure 74 is comprised of a multi-layer structure including a first undoped InAs spacer layer 74C-1 formed on the p-type InAs base layer 73, a first undoped AlSb quantum barrier layer 74B-1 formed on the first undoped InAs spacer layer 74C-1, an undoped InAs quantum well layer 74A formed on the first undoped AlSb quantum barrier layer 74B-1, a second undoped AlSb quantum barrier layer 74B-2 formed on the undoped InAs quantum well layer 74A, and a second undoped InAs spacer layer 74C-2 formed on the second undoped AlSb quantum barrier layer 74B-2.

The RTT is equivalent to a circuit illustrated in FIG. 9C, which has a hole-conductivity type RTD disposed between a base region and a base electrode of an n-p-n hetero-junction bipolar transistor, and exhibits a negative input conductance based on the resonant tunneling effect of holes.

In the instant embodiment, the emitter electrode 7E of the thus completed RTT is grounded, input signals are introduced into the base electrode 7B, and output signals are taken out through the collector electrode 7C. That is, the NDR amplifier is fabricated by electrically connecting the grounding terminals 1b and 2b to the emitter electrode 7E, the input signal terminal 1a to the base electrode 7B, and the output signal terminal 2a to the collector electrode 7C in FIG. 2A.

The NDR amplifier illustrated in FIGS. 3A, 5A, 6A, 7A, 8A and 9A all exhibit a flat dependency on frequency, similarly to the NDR amplifier illustrated in FIG. 2A.

As explained so far, the invention provides a negative differential resistance amplifier which is superior in signal-unilaterality and is capable of providing higher gain, lower noise, and wider band by setting appropriate matching conditions between a signal source circuit and RTT biased in a negative input conductance region. That is, since input terminals are separated from output terminals, the signal-unilaterality is ensured and a gain can be enhanced. Thus, an influence by noise source existing at output side can be disregarded. In addition, since frequency spectrum of noise source is white in color, the dependency of noise figure on frequency is flat. Furthermore, a resonant tunneling diode has a high maximum oscillation frequency, which ensures wider band.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application Nos. 8-213502 and 9-25434 filed on Aug. 13, 1996 and Feb. 7, 1997 each including specification, claims, drawings and summary is incorporated herein by reference in its entirety.

What is claimed is:

1. A negative differential resistance amplifier comprising a negative differential resistance transistor having negative input conductance induced by a resonant tunneling effect, said transistor being electrically connected to a signal source circuit in cascade, the following relation being established in said negative differential resistance amplifier:

$$0 < g_s - g_i < G$$

wherein gs (gs>0) indicates a conductance measured when viewed from an interface between said negative differential resistance transistor and said signal source circuit to said signal source circuit, −gi (gi>0) indicates a conductance of said negative differential resistance transistor, and G (G<gs) indicates a predetermined conductance.

2. The negative differential resistance amplifier as set forth in claim 1, further comprising an input matching circuit electrically connected to said signal source circuit in cascade.

3. The negative differential resistance amplifier as set forth in claim 1, further comprising an output matching circuit electrically connected to output ports of said negative differential resistance transistor.

4. The negative differential resistance amplifier as set forth in claim 2, further comprising an output matching circuit electrically connected to output ports of said negative differential resistance transistor.

5. A negative differential resistance amplifier comprising a negative differential resistance transistor having negative input conductance induced by a resonant tunneling effect, said transistor being electrically connected to a signal source circuit in cascade, the following relation being established in said negative differential resistance amplifier:

$$0 < gs - gi < G$$

wherein gs (gs>0) indicates a conductance measured when viewed from an interface between said negative differential resistance transistor and said signal source circuit to said signal source circuit, −gi (gi>0) indicates a conductance of said negative differential resistance transistor, and G (G<gs) indicates a predetermined conductance, said negative differential resistance transistor including a field effect transistor structure and a resonant tunneling diode structure.

6. The negative differential resistance amplifier as set forth in claim 5, further comprising an input matching circuit electrically connected to said signal source circuit in cascade.

7. The negative differential resistance amplifier as set forth in claim 5, further comprising an output matching circuit electrically connected to output ports of said negative differential resistance transistor.

8. The negative differential resistance amplifier as set forth in claim 6, further comprising an output matching circuit electrically connected to output ports of said negative differential resistance transistor.

9. The negative differential resistance amplifier as set forth in claim 5, wherein said field effect transistor structure includes a channel region and a source electrode between which said resonant tunneling diode is formed.

10. The negative differential resistance amplifier as set forth in claim 5, wherein a source electrode of said field effect transistor structure is electrically connected to a first contact region of said resonant tunneling diode structure, and a gate electrode of said field effect transistor structure is electrically connected to a second contact region of said resonant tunneling diode structure.

11. The negative differential resistance amplifier as set forth in claim 5, wherein said field effect transistor structure includes a channel region and a gate electrode which are electrically connected to each other through said resonant tunneling diode structure.

12. The negative differential resistance amplifier as set forth in claim 5, wherein said resonant tunneling diode comprises a quantum well structure, said quantum well structure being designed to lower a ratio of a current to a negative differential conductance in said negative differential resistance amplifier.

13. A negative differential resistance amplifier comprising a negative differential resistance transistor having negative input conductance induced by a resonant tunneling effect, said transistor being electrically connected to a signal source circuit in cascade, the following relation being established in said negative differential resistance amplifier:

$$0 < gs - gi < G$$

wherein gs (gs>0) indicates a conductance measured when viewed from an interface between said negative differential resistance transistor and said signal source circuit to said signal source circuit, −gi (gi>0) indicates a conductance of said negative differential resistance transistor, and G (G<gs) indicates a predetermined conductance, said negative differential resistance transistor including a bipolar transistor structure and a resonant tunneling diode structure.

14. The negative differential resistance amplifier as set forth in claim 13, further comprising an input matching circuit electrically connected to said signal source circuit in cascade.

15. The negative differential resistance amplifier as set forth in claim 13, further comprising an output matching circuit electrically connected to output ports of said negative differential resistance transistor.

16. The negative differential resistance amplifier as set forth in claim 14, further comprising an output matching circuit electrically connected to output ports of said negative differential resistance transistor.

17. The negative differential resistance amplifier as set forth in claim 13, wherein said bipolar transistor structure includes a base region and an emitter electrode which are electrically connected to each other through said resonant tunneling diode structure.

18. The negative differential resistance amplifier as set forth in claim 13, wherein an emitter electrode of said bipolar transistor structure is electrically connected to a first contact region of said resonant tunneling diode structure, and a base electrode of said bipolar transistor structure is electrically connected to a second contact region of said resonant tunneling diode structure.

19. The negative differential resistance amplifier as set forth in claim 13, wherein said bipolar transistor structure includes a base region and a base electrode which are electrically connected to each other through said resonant tunneling diode structure.

20. The negative differential resistance amplifier as set forth in claim 13, wherein said resonant tunneling diode comprises a quantum well structure, said quantum well structure being designed to lower a ratio of a current to a negative differential conductance in said negative differential resistance amplifier.

21. The negative differential resistance amplifier as set forth in claim 1, wherein said negative differential resistance transistor comprises an undoped GaAs spacer layer with a thickness of at least 20 nm, such that the dependency of the noise figure on the frequency is substantially flat through at least 100 GHz.

22. The negative differential resistance amplifier as set forth in claim 10, wherein said resonant tunneling diode structure further comprises:

an undoped GaAs spacer layer with a thickness of at least 20 nm, such that the dependency of the noise figure on the frequency is substantially flat through at least 100 GHz; and a quantum well structure, said quantum well structure being designed to lower a ratio of a current to a negative differential conductance in said negative differential resistance amplifier.

23. The negative differential resistance amplifier as set forth in claim 11, wherein said resonant tunneling diode structure comprises:

an undoped GaAs spacer layer with a thickness of at least 20 nm, such that the dependency of the noise figure on the frequency is substantially flat through at least 100 GHz; and a quantum well structure, said quantum well structure being designed to lower a ratio of a current to a negative differential conductance in said negative differential resistance amplifier.

24. The negative differential resistance amplifier as set forth in claim 9, wherein said resonant funneling diode structure further comprises:

an undoped GaAs spacer layer with a thickness of at least 20 nm; and a quantum well structure being designed to lower a ratio of a current to a negative differential conductance in said negative differential resistance amplifier.

* * * * *